(12) United States Patent
Kalnitsky

(10) Patent No.: US 9,209,683 B2
(45) Date of Patent: Dec. 8, 2015

(54) STRUCTURE AND METHOD FOR A SWITCHED CIRCUIT DEVICE

(75) Inventor: Alexander Kalnitsky, San Francisco, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 386 days.

(21) Appl. No.: 13/599,909

(22) Filed: Aug. 30, 2012

(65) Prior Publication Data

US 2013/0320945 A1 Dec. 5, 2013

Related U.S. Application Data

(60) Provisional application No. 61/654,286, filed on Jun. 1, 2012.

(51) Int. Cl.
*G05F 1/46* (2006.01)
*H02M 3/155* (2006.01)
*H01L 29/78* (2006.01)

(52) U.S. Cl.
CPC ............... *H02M 3/155* (2013.01); *H01L 29/78* (2013.01); *H01L 29/7816* (2013.01)

(58) Field of Classification Search
CPC ..... H02M 3/155; H02M 3/156; H02M 3/158; H01L 29/78; H01L 29/7816
USPC ............ 323/282–285, 368; 257/24, 107, 133, 257/369
See application file for complete search history.

(56) References Cited

U.S. PATENT DOCUMENTS

| | | | | |
|---|---|---|---|---|
| 7,262,476 B2 * | 8/2007 | Bude et al. | ..................... | 257/493 |
| 7,453,083 B2 * | 11/2008 | King | ............................... | 257/24 |
| 7,995,380 B2 * | 8/2011 | Liu | ................................. | 365/159 |
| 8,212,315 B2 * | 7/2012 | Lotfi et al. | ..................... | 257/334 |
| 8,357,986 B2 * | 1/2013 | Wang et al. | ................... | 257/492 |

* cited by examiner

*Primary Examiner* — Jessica Han
(74) *Attorney, Agent, or Firm* — Haynes and Boone, LLP

(57) ABSTRACT

The present disclosure provides a switched voltage converter for receiving a source voltage and producing an output voltage. The voltage converter comprises a switch controller and a switched device communicatively coupled to the switch controller. The switch controller adjusts the output voltage by controlling a duty cycle of the switched device. The switched device is sized such that it is characterized by a drain-to-source breakdown voltage greater than or substantially equal to the source voltage and the output voltage and is further characterized by a hot-carrier injection rating less than the source voltage or the output voltage. In further embodiments, the switched device is sized such that it is characterized by a drain-to-source breakdown voltage greater than or substantially equal to a peak operating voltage and is further characterized by a hot-carrier injection rating less than the peak operating voltage.

20 Claims, 10 Drawing Sheets

STRUCTURE AND METHOD FOR A SWITCHED CIRCUIT DEVICE

PRIORITY DATA

The present application claims priority to U.S. Provisional Application Ser. No. 61/654,286, filed Jun. 1, 2012, the disclosure of which is incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device design are needed.

One class of IC devices includes switched circuit devices such as DC/DC voltage converters. Further improvements to this class of device have proven characteristically difficult to obtain. Particularly with regard to voltage converters, the ability to scale the IC components has been hampered by the requirement that the components must withstand relatively large voltages. Realities such as hot-carrier degradation and their effects on device performance and longevity must be considered. Therefore, while existing power converting devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
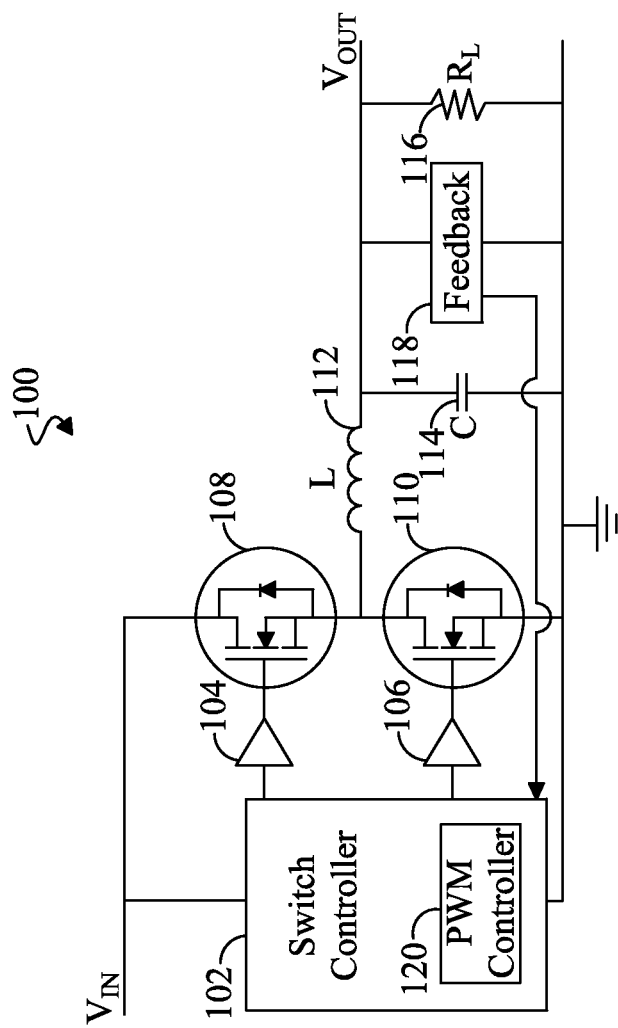
FIG. 1 is a schematic illustration of a voltage converter according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic illustration of a voltage converter 100 according to various aspects of the present disclosure. The voltage converter 100 may be referred to as a buck converter or a DC/DC down converter and, in various embodiments, includes a switch controller 102, gate drivers 104 and 106, a high-side device 108, a low-side device 110, an inductor 112, a capacitor 114, and a load modeled as a resistor 116. In some embodiments, the voltage converter 100 further includes a feedback monitor 118.

The voltage converter 100 operates to convert a supply voltage $V_{in}$ into a lower source voltage $V_{out}$. A range of supply voltages are contemplated, and, in any single embodiment, the supply voltage may vary over time. In an exemplary embodiment where $V_{in}$ is supplied by a Li-ion battery, maximum $V_{in}$ is 4.2V. In another embodiment where $V_{in}$ is supplied by a processor power supply rail, $V_{in}$ is roughly 1V. In yet another embodiment, $V_{in}$ is 14V. It is understood that these embodiments are offered merely as examples. The switch controller controls the source voltage $V_{out}$ relative to the supply voltage $V_{in}$ by controlling the duty cycle of the voltage converter 100. At a high-level, the switch controller 102 cycles between loading and discharging the inductor 112 by alternating between a switch-on mode and a switch-off mode. In the switch-on mode, a gate driver 104 activates a high-side device 108. In various embodiments, the high-side device 108 includes an n-type or p-type laterally diffused metal-oxide-semiconductor (LDMOS) device, a power MOSFET such as a vertically diffused MOS (VDMOS) device, a conventional MOSFET device, and/or another transistor. In some embodiments, the high-side device 108 also includes an integrated body diode and/or a separate diode such as a Schottky diode. When activated, current flow through the high-side device 108 charges the inductor 112.

In the switch-off mode, the high-side device 108 is deactivated and a gate driver 106 activates a low-side device 110. Similar to the high-side device 108, the low-side device 110 may include a transistor such as an LDMOS and/or a regular MOS device, and may also include a diode such as an integrated body diode or a separate diode such as a Schottky diode. In the switch-off mode, the inductor 112 discharges stored energy to maintain a constant $V_{out}$ across the resistive load. Because of the symmetry of arrangement and operation, the high-side device 108 and the low-side device 110 may be referred to as a complimentary pair of switched devices.

By altering the duty cycle of the two modes, the switch controller 102 controls the voltage $V_{out}$. In an embodiment, this is accomplished using a pulse-width modulation (PWM) controller 120 incorporated into the switch controller 102. The pulse-width modulation controller 120 may activate gate driver 104 and gate driver 106 in an alternating fashion to control the duty cycle. In some embodiments, the switch controller 102 maintains a guard band in the duty cycle to protect against both the high-side device 108 and the low-side device 110 being active at the same time. This condition, called cross-conduction, allows current to flow from $V_{in}$ to ground with very little resistance resulting in considerable energy loss. To compensate, the switching scheme may ensure that both devices 108 and 110 are inactive before enabling either one. This dead time affects the duty cycle and may prevent optimal performance.

To accurately model the behavior of the voltage converter 100, the source voltage may be analyzed in two different operating modes, continuous and discontinuous. In continuous mode, defined as a duty cycle where the energy stored in the inductor is not completely expended, the ideal behavior of the voltage converter may be modeled as:

$$V_{out} = D \times V_{in}$$

where D is the duty cycle (the time in the switch-on mode divided by the period of the cycle). In discontinuous mode, the energy in the inductor is completely expended before the end of the switch-off period. The ideal behavior of the voltage converter in discontinuous mode may be modeled as:

$$V_{out} = V_{in} \times \frac{2}{1 + \sqrt{1 + \frac{8L}{D^2(R_{out}T_C)}}}$$

where L is the inductance of the inductor 112, $R_{out}$ is the output load resistance, and $T_C$ is the period of the cycle.

These equations assume perfect efficiency on the part of the voltage converter 100. However, non-ideal behavior of the components of the voltage converter 100 as well as behavior of the load may cause $V_{out}$ to vary. One relevant factor is the voltage drop and the associated power loss through the high-side device 108 and low-side device 110. This is often modeled as a device resistance $R_{DSON}$ (the drain-to-source resistance when the device is active or turned on). To accommodate these realities and others, the voltage converter 100 may include a feedback monitor 118, which monitors $V_{out}$ and adjusts the duty cycle according to the actual behavior.

During operation, the high-side 108 and low-side 110 devices experience an operating drain-to-source voltage $V_{ds}$, which may peak at voltages beyond the greater of $V_{in}$ and $V_{out}$. In designing a circuit such as voltage converter 100, certain component design rules are used to ensure safe and reliable operation of the device. For example, devices such as the high-side device 108 or low-side device 110 may be characterized by a breakdown voltage. In some embodiments, such devices are configured to have breakdown voltages (e.g., a steady state drain-to-source breakdown voltage $BV_{dss}$) less than the peak operating voltage $V_{ds}$. In another example of a design rule, components may be required to have a particular hot-carrier injection (HCI) rating at a given voltage. Hot carrier injection refers to a condition where electrons or holes have sufficient kinetic energy cross material boundaries. For example, a hot carrier may pass from the device channel to the device gate. This may affect the device threshold voltage and may result in linear region current, saturation current degradation, leakage current and/or gate current. It may also lead to breakdown of insulating materials and associated changes in device behavior. The cumulative damage is referred to as hot carrier degradation, and over time it may cause the device to fail. Because smaller device dimensions are often more susceptible to hot-carrier injection, one strategy to improve the functional lifetime of the device is to require a certain device sizing for a given operational voltage.

Figure 2:
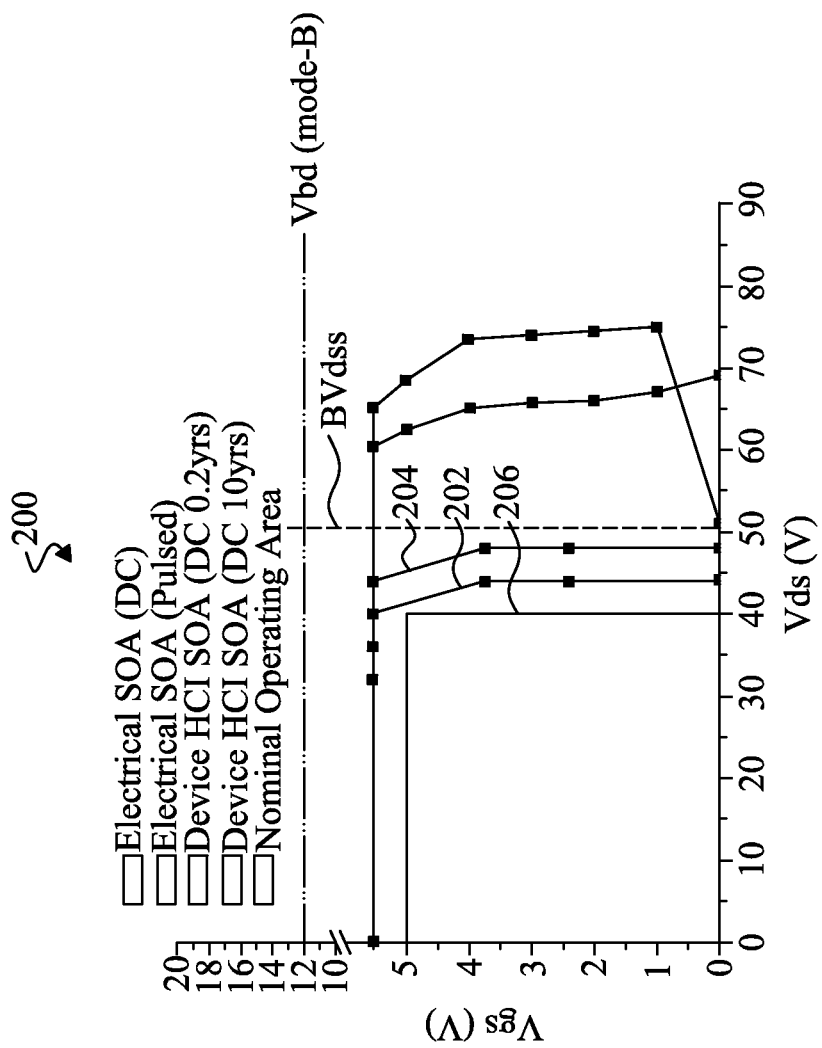
FIG. 2 is a plot of functional voltages and safe operating area for an exemplary field-effect transistor according to various aspects of the present disclosure.

FIG. 2 is a plot 200 of functional voltages and safe operating area for an exemplary field-effect transistor according to various aspects of the present disclosure. The exemplary device is a 40V-rated LDMOS device. Safe operating areas (SOAs) for the device are plotted over a number of operating conditions. The resulting curves indicate projected longevity. For example, the 10-year safe operating area (labeled: DC 10 yrs) 202 indicates that the exemplary device can be expected to last at least 10 years operating continuously within this range. The 0.2-year safe operating area (DC 0.2 yrs) 204 indicates that the device operating continuously within this range can be expected to last at least 0.2 years. In some embodiments, this rating roughly corresponds to the 10-year safe operating area in an alternating current application. To prolong the functional life of the device, a Nominal Operating Area (NOA) 206 may be specified that provides additional guard banding against failures such as hot-carrier degradation. In some design environments, it is required that designers utilize HCI compliant devices operating within the NOA of each device in all applications.

Figure 3:
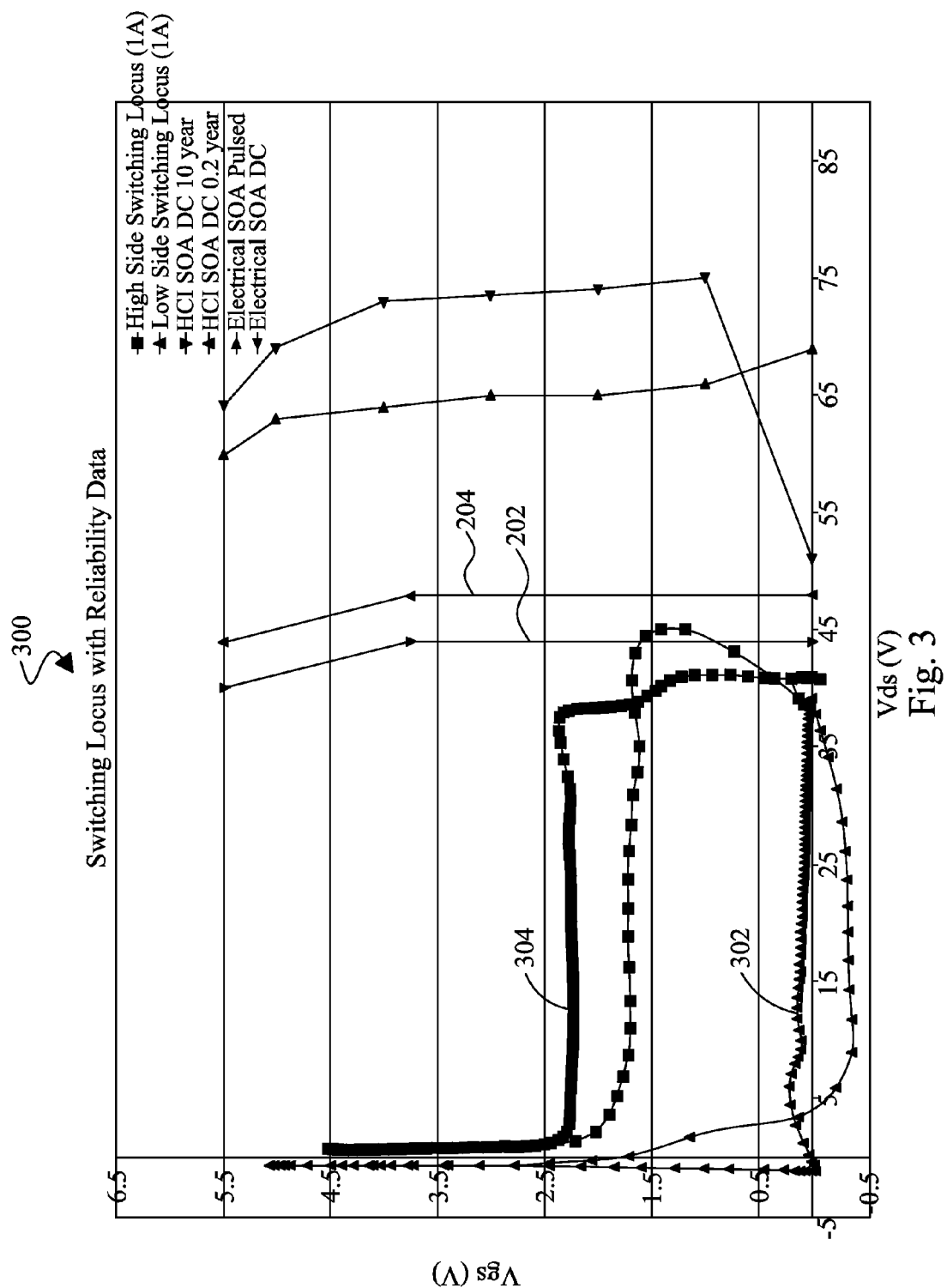
FIG. 3 is a plot of measured operating ranges for an exemplary high-side device and low-side device in a switched DC/DC down converter according to various aspects of the present disclosure.

FIG. 3 is a plot 300 of measured operating ranges for an exemplary high-side device 108 and low-side device 110 in a switched DC/DC down converter according to various aspects of the present disclosure. The voltage converter is substantially similar to the voltage converter 100 of FIG. 1, and operates at an exemplary $V_{in}$ of 40V. Referring to FIG. 3, the operating ranges are overlaid with safe operating areas similar to those of FIG. 2. Curve 302 indicates the operating behavior of the low-side device 110. As can be seen from curve 302, in the illustrated embodiment, the operating voltage $V_{ds}$ of the low-side device does not exceed the 10-year safe operating area 202 during operation. Curve 304 indicates the operating behavior of the high-side device 108. While the $V_{ds}$ of the high-side device does occasionally approach the 0.2-year safe operating area 204, it does so for only a small portion of the duty cycle. Based on the behavior plotted on FIG. 3, in the illustrated embodiment, it may be possible to achieve sufficient device longevity without utilizing HCI-compliant devices. As will be explained below, in some embodiments, optimal performance is achieved by substituting transistor devices with HCI ratings below the peak operating voltage.

Figure 4:
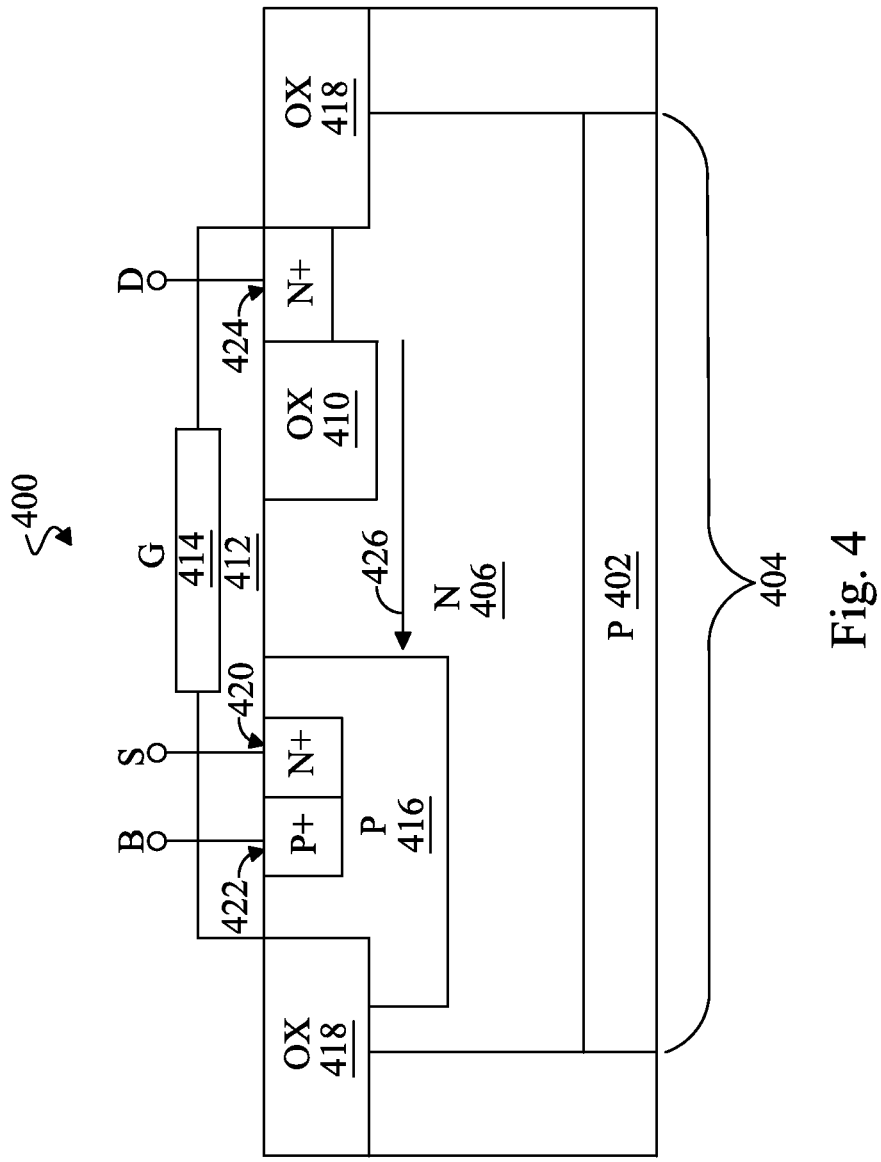
FIG. 4 is a cross-sectional view of an LDMOS device according to various aspects of the present disclosure.

FIG. 4 is a cross-sectional view of an LDMOS device 400 according to various aspects of the present disclosure. While the illustrated LDMOS device 400 is an n-type device, the following concepts apply equally to a p-type device and the disclosure is in no way limited to either n-type or p-type devices. The LDMOS device 400 includes a substrate 402 that may include an elementary semiconductor such as silicon or germanium and/or a compound semiconductor, such as silicon germanium, silicon carbide, gallium arsenic, indium arsenide, gallium nitride, and indium phosphide. Other exemplary substrates 402 include alloy semiconductors, such as silicon germanium carbide, gallium arsenic phosphide, and gallium indium phosphide. The substrate 402 may have one or more layers defined within it. In some embodiments, the substrate layers include an epitaxial layer. In one such embodiment, the substrate contains an epitaxial layer overlying a bulk semiconductor. Other layered substrates include semiconductor-on-insulator (SOI) substrates. In one such SOI substrate, the substrate 402 includes a buried oxide (BOX) layer formed by a process such as separation by implanted oxygen (SIMOX).

Various features formed in and on the substrate 402 combine to form the LDMOS device 400. For example, the substrate 402 may include various doped regions depending on design requirements as known in the art (e.g., p-type wells or n-type wells). In the present embodiment, the substrate 402 includes various doped regions in the device region 404 that are configured to form the n-channel LDMOS device 400. The doped regions are doped with p-type dopants, such as boron or $BF_2$, and/or n-type dopants, such as phosphorus or arsenic. The doped regions may be formed directly on the substrate 402, in a P-well structure, in an N-well structure, in a dual-well structure, or using a raised structure. In the present embodiment, the substrate 402 includes an n-well region 406. The n-well region 406 is a deep n-well region that functions as a drift region (n-drift) for the LDMOS device 400. The n-well region 406 may include a p-buried layer (PBL) positioned at an interface between the n-well region 406 and p-doped substrate 402 and underlying a drain region of the LDMOS device 400. A dielectric feature 410, such as an oxide feature, may also be formed within n-well region 406 proximate to the device drain.

The LDMOS device 400 includes a gate structure disposed over the substrate 402. In the present embodiment, the gate structure includes a gate dielectric 412 and a gate electrode 414 disposed on the gate dielectric 412. In various embodiments, the gate structure includes other elements, such as interfacial layers and gate spacers. In an embodiment, the gate dielectric 412 includes a silicon dioxide layer formed by thermal oxidation, chemical vapor deposition (CVD), physical vapor deposition (PVD), atomic layer deposition (ALD), other suitable processes, or combinations thereof. In an embodiment, the gate dielectric 412 includes a high-k dielectric material, silicon oxynitride, silicon nitride, other suitable dielectric materials, and/or combinations thereof. Exemplary high-k dielectric materials include $HfO_2$, HfSiO, HfSiON, HfTaO, HfTiO, HfZrO, other suitable high-k dielectric materials, and/or combinations thereof. In some embodiments, the gate dielectric 412 has a multilayer structure, such as a layer of silicon oxide and a layer of a high-k dielectric material formed on the silicon dioxide layer.

The gate electrode 414 is disposed overlying the gate dielectric 412, and the electrode 414 may include a polycrystalline silicon (polysilicon) material. Alternatively, the gate electrode 414 may include a metal, such as Al, Cu, W, Ti, Ta, TiN, TaN, NiSi, CoSi, other suitable conductive materials, or combinations thereof. In various embodiments, the gate electrode 414 is formed by CVD, PVD, plating, and/or other suitable processes. In some embodiments having a multilayer gate electrode 414, the electrode 414 is formed by a multiple-step process.

The substrate may also contain a p-type base (also referred to as p-body) region 416 formed proximate to a source side of the device and laterally interposed between the gate structure (gate dielectric 412 and gate electrode 414) and an isolation structure 418. The p-type base region 416 may include a p-type dopant, such as boron, implanted by an ion implantation process. In an example of such a process, an ion-implantation method incorporating a tilt angle implantation is used to form the p-type base region 416, such that the p-type base region 416 is extended partially underneath the gate electrode 414. To optimize the channel length, the tilt angle of the ion implantation can be modified.

The LDMOS device 400 may be defined by a source region 420, a body contact region 422 adjacent to the source region 420, and a drain region 424. In the illustrated embodiment, the source region 420 and the body contact region 422 are formed in the p-type base region 416, and the drain region 424 is formed in the n-well region 406, disposed between the dielectric feature 410 and isolation structure 418. In the present embodiment, the source region 420 and the drain region 424 are doped with n-type impurities (N+), such as phosphorous or arsenic, such that the LDMOS device 400 is configured as n-channel LDMOS devices. The source and drain regions may have different structures, such as raised, recessed, and/or strained features. The body contact region 422 is doped with p-type impurities (P+), such as boron.

In the present embodiment, isolation structures 418 define and electrically isolate the various device (or active) regions of the substrate 402, such as device regions 404. The isolation structures 418 may be formed of a dielectric material, such as an oxide or nitride isolation material. The isolation structures 418 can include shallow trench isolation (STI) features, field oxide (FOX) features, deep trench isolation (DTI) features, or local oxidation of silicon (LOCOS) features, or combinations thereof. Different embodiments may incorporate different elements, and no particular element is necessarily required of any embodiment.

The LDMOS 400 device may be configured to have desired operating characteristics such as a given hot-carrier injection rating or a given breakdown voltage. For example, in some LDMOS devices, resilience to hot-carrier degradation can be determined from and adjusted by modifying the length of the drift region (indicated by arrow 426). In some LDMOS devices, HCI ratings may be determined from and adjusted by modifying doping concentrations of one or more doped regions including the source region 420, the drain region 424, the n-well region 406, the p-type base region 416, and/or the body contact region 422. In some LDMOS devices, HCI ratings may be determined from and adjusted by modifying the thickness of the gate dielectric 412. In another example, in some LDMOS devices, a breakdown voltage such as the drain-to-source breakdown voltage $BV_{dss}$ may be determined from and adjusted by modifying the drift region 426 length. Further design modifications will be known to one of skill in the art.

As noted above, in some embodiments, the LDMOS 400 is not required to be HCI-compliant at the peak $V_{ds}$. Therefore, in some such embodiments, characteristics of the LDMOS are relaxed relative to an HCI-compliant device. Particularly, the drift region length (indicated by arrow 426) may be reduced. In some embodiments, the characteristics are determined in order to maintain a breakdown voltage of the device above a threshold while reducing an HCI rating below the threshold.

This configuration conveys several benefits. For example, reducing the drift region length may reduce the overall size of the LDMOS 400 resulting in a smaller device footprint and better device spacing. Reducing the drift region length may also reduce $R_{DSON}$, the resistance of the device when in active mode. $R_{DSON}$ corresponds to lost energy. Thus, reducing the drift region length of, for example, a high-side device 108 in voltage converter 100 may improve the overall voltage converter efficiency. In some embodiments, reducing the drift region length reduces both $R_{DSON}$ and $C_G$, the gate capacitance of the LDMOS 400 device. Gate capacitance contributes to inefficiency as the transistor may require more energy to switch and may exhibit increased transition time. In some embodiments, a voltage converter compensates for the improved performance by reducing the cross-conduction guard band. This improves efficiency and may allow the converter to operate at higher duty cycles and/or higher frequencies. In one such embodiment, this allows the use of a lower supply voltage $V_{in}$. In another such embodiment, this allows the use of smaller inductor 112 and/or capacitor 114 components. In a further such embodiment, this allows the use of a lower supply voltage $V_{in}$, a smaller inductor 112, and a smaller capacitor 114.

Figure 5:
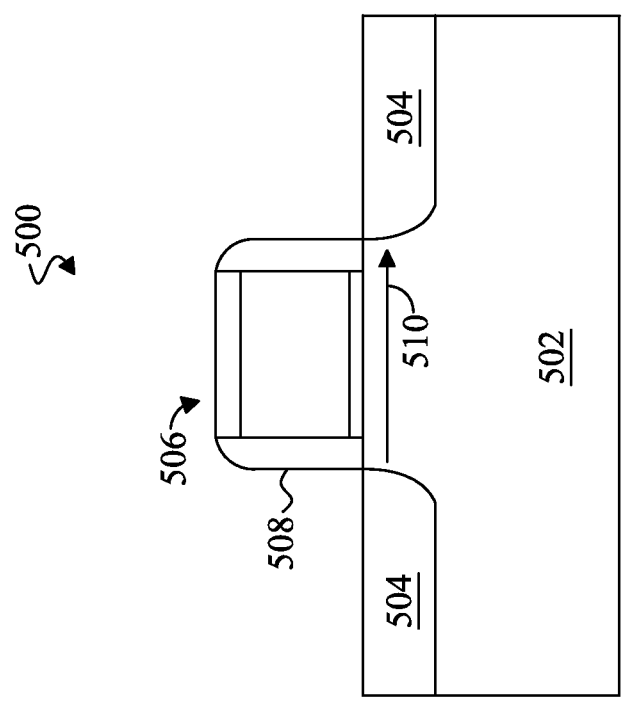
FIG. 5 is a cross-sectional view of a MOSFET device according to various aspects of the present disclosure.

FIG. 5 is a cross-sectional view of a MOSFET device 500 according to various aspects of the present disclosure. The MOSFET includes a substrate 502. Similar to substrate 402 of FIG. 4, the substrate may be a wafer, a semiconductor substrate, or any base material on which processing is conducted to produce layers of material, pattern features, and/or integrated circuits. In the present example, the substrate 502 is a bulk silicon substrate. Alternatively, the substrate 502 may include an elementary semiconductor including silicon or germanium in crystal; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Alloy semiconductor substrates 502 may have a gradient SiGe feature in which the Si and Ge composition change from one ratio at one location to another ratio at another location of the gradient SiGe feature. The alloy SiGe may be formed over a silicon substrate. In some embodiments, the substrate 502 includes more than one layer. Examples of such layers include the insulator layer of a semiconductor on insulator (SOI) structure, a doped epi layer, a multilayer compound semiconductor structure, and/or a non-semiconductor material, such as a glass, fused quartz, or calcium fluoride for a photomask (mask).

In the illustrated embodiment, device features, including those of MOSFET 500, are formed on the substrate 502. These features may include doped regions such as p-type wells or n-type wells and may be formed directly on the substrate, in a P-well structure, in a N-well structure, in a dual-well structure, or using a raised structure. The semiconductor substrate may further include various active regions, such as regions configured for an N-type metal-oxide-semiconductor transistor device (referred to as an NMOS) and regions configured for a P-type metal-oxide-semiconductor transistor device (referred to as a PMOS). Examples of active regions include the source/drain regions 504 of MOSFET 500. The source/drain regions 504 may be doped with p-type dopants (P+), such as boron or $BF_2$, and/or n-type dopants (N+), such as phosphorus or arsenic. In some embodiments, the source/drain regions are formed by processes including halo implantation, etching, ion-implantation, epitaxy, and/or annealing steps. It is understood that the MOSFET 500 may be formed by conventional FET technology processing, and thus some processes are not described in detail herein.

In many embodiments, the MOSFET 500 includes a gate stack 506, which may be formed on the substrate 502. In a gate first process, the gate stack 506 may be all or part of a functional gate. Conversely, in a gate last process, the gate stack 506 may be a dummy gate. An exemplary gate stack 506 includes an interfacial layer, a gate dielectric layer, a gate electrode layer, and a hard mask layer. An exemplary interfacial layer includes silicon oxide (e.g., thermal oxide or chemical oxide) and/or silicon oxynitride (SiON) and may be formed by any suitable process to any suitable thickness. The gate dielectric layer may comprise a dielectric material, such as silicon oxide, silicon nitride, silicon oxynitride, high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Despite the naming convention, MOSFET 500 includes embodiments with polysilicon gate electrodes as well as metal gate electrodes. Accordingly, the gate electrode layer may include any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. Suitable materials for the hard mask layer include, for example, silicon, dioxide, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material. The gate stack 506 is formed by any suitable process or processes. For example, the gate stack 506 can be formed by a procedure including deposition, photolithography patterning, and etching processes. In some embodiments, spacers 508 are subsequently formed on one or more lateral surfaces of the gate stack 506.

The source/drain regions 504, the spacers 508, and/or the gate stack 506 define a channel region (indicated by arrow 510). The channel region 510 length is one factor that may affect operating characteristics of the MOSFET 500. For example, in some MOSFET devices, resilience to hot-carrier degradation can be determined from and adjusted by modifying the length of the channel region 510. In some MOSFET devices, HCI ratings may be determined from and adjusted by modifying doping concentrations of one or more doped regions including the source/drain regions 504. In some MOSFET devices, HCI ratings may be determined from and adjusted by modifying the thickness of the gate dielectric include in the gate stack 506. In another example, in some MOSFET devices, a breakdown voltage such as the drain-to-source breakdown voltage $BV_{dss}$ may be determined from and adjusted by modifying the channel region 510 length. Further design modifications will be known to one of skill in the art.

Figure 6:
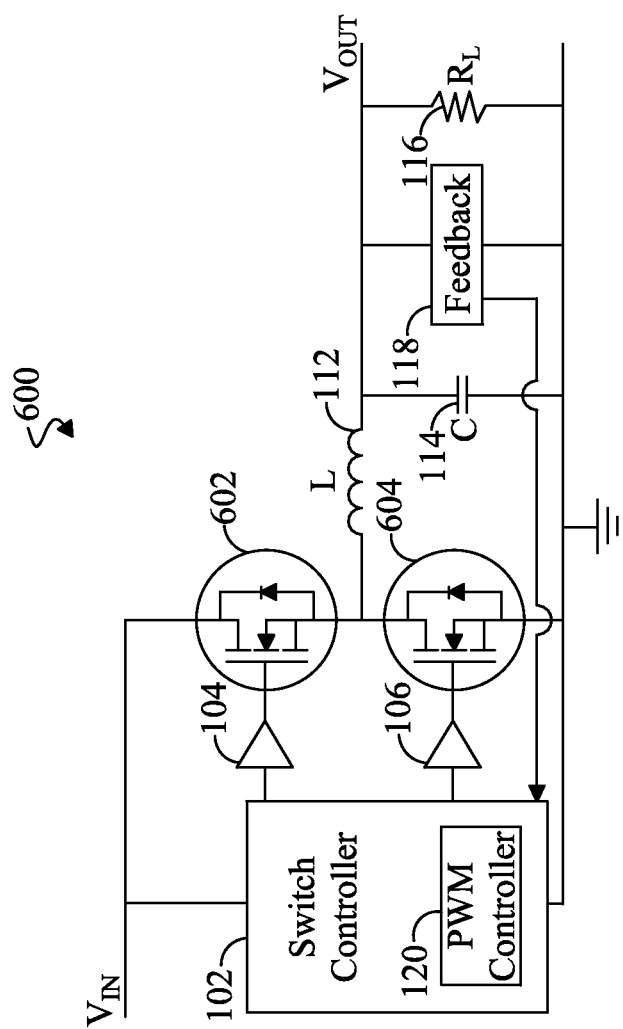
FIG. 6 is a schematic illustration of a buck converter according to various aspects of the present disclosure.

FIG. 6 is a schematic illustration of a buck converter 600 according to various aspects of the present disclosure. In many respects, the buck converter 600 is substantially similar to the voltage converter 100 of FIG. 1. In various embodiments, the buck converter 600 includes a switch controller 102, gate drivers 104 and 106, an inductor 112, a capacitor 114, a load modeled as a resistor 116, a feedback monitor 118, and/or a pulse-width modulation controller 120. These are substantially similar to the respective elements described with reference to FIG. 1.

In the illustrated embodiment, the buck converter 600 also includes a high-side device 602 and a low-side device 604. The high-side device 602, and/or the low side-device 504 may be configured in accordance with the principles described above. For example, in some embodiments where $V_{in}$ is 26.4V, the buck converter 600 incorporates a high-side device 602 with an HCI rating of less than 26.4V. The particular HCI rating of interest may be a nominal operating area, an HCI 10-year safe operating area, an HCI 0.2-year safe operating area, and/or another suitable HCI rating. To prevent breakdown behavior, the high-side devices 502 of any of these embodiments may be configured have a breakdown voltage (e.g., $BV_{dss}$) greater than 26.4V. In order to achieve these operating characteristics, in some exemplary embodiments, the LDMOS high-side device 602 is characterized by a shorter drift region length than a reference LDMOS device with an HCI rating meeting or exceeding 26.4V. In further exemplary embodiments, the buck converter 600 includes an LDMOS high-side device 602 characterized by a shorter drift region length but a substantially equivalent breakdown voltage as compared to a reference LDMOS device with an HCI rating at or above $V_{in}$. In one example, an HCI rating of an LDMOS high-side device 602 was reduced by 35% by reducing the device pitch by 11.6%. This had the effect of reducing the drift region length and produced a 25% reduction in resistance $R_{on}$ without affecting the breakdown voltage $BV_{dss}$.

Similar principles may be applied to the low-side device 604. In some embodiments where $V_{in}$ is 26.4V, the buck converter 600 includes a low-side device 604 with an HCI rating (e.g., a nominal operating area or a safe operating area) of less than 26.4V. In one such embodiment, an LDMOS low-side device 604 is characterized by a shorter drift region length than a reference LDMOS device with an HCI rating of 26.4V. In another embodiment, the buck converter 600 includes an LDMOS low-side device 604 characterized by a shorter drift region length but a substantially equivalent breakdown voltage as compared to a reference LDMOS device with an HCI rating of 26.4V.

In further embodiments, for example those used in Li-Ion devices, the high-side device 602 and/or the low-side device 604 includes a MOSFET device with an HCI rating of less than $V_{in}$. The MOSFET device may be further characterized by a breakdown voltage greater than or equal to $V_{in}$. In regular MOSFET devices, the gate length may be tuned for HCI compliance. Thus, the MOSFET device (e.g., high-side 602 and/or low side device 604) may have a reduced gate length and therefor proportionally lower $R_{on}$ and $C_g$ compared to a device with a NOA rating at or above $V_{in}$. Despite the reduced gate length, the MOSFET device may retain a breakdown voltage substantially similar to the reference device. In one embodiment, a MOSFET device length was reduced by 16.7%. This had the effect of reducing the resistance $R_{on}$ by 12-25% depending on the application without substantially changing the breakdown voltage compared to the reference length.

In further embodiments, a peak operating voltage $V_{ds}$ is determined instead of using $V_{in}$ or $V_{out}$ as the reference voltage. The peak operating voltage $V_{ds}$ may meet or exceed $V_{in}$ and/or $V_{out}$. Peak $V_{ds}$ may be determined for the high-side device 602 and/or low-side device 604 together or separately. In some such embodiments, the device or devices may be configured to have an HCI rating of less than the peak operating voltage $V_{ds}$. The same devices may be further configured to have breakdown voltage, such as $BV_{dss}$, exceeding the peak operating voltage $V_{ds}$.

Figure 7:
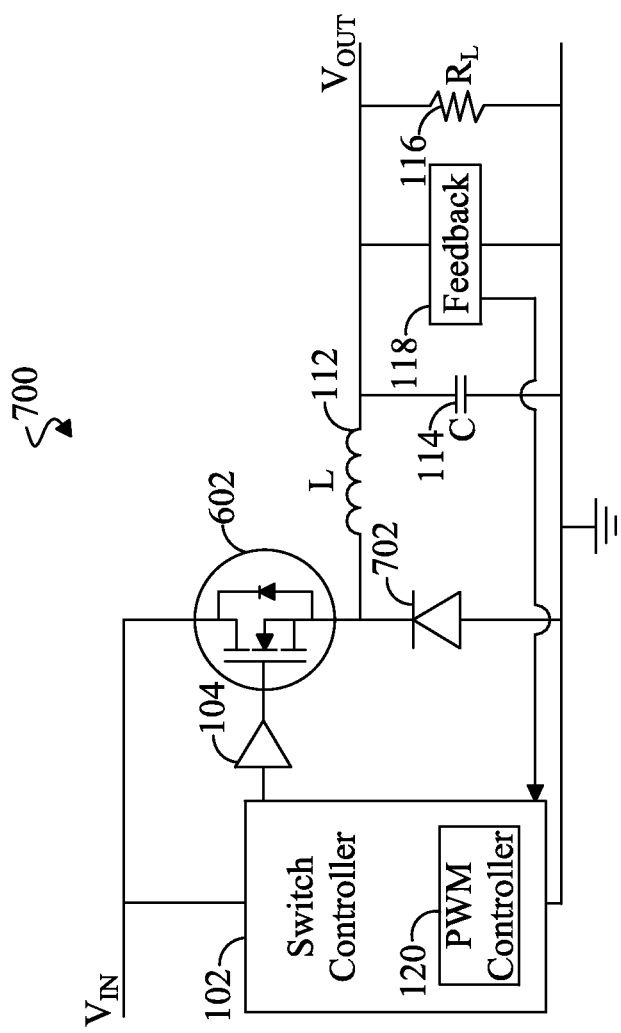
FIG. 7 is a schematic illustration of a single-switch buck converter according to various aspects of the present disclosure.

It is understood that the buck converter 600 is merely one application of the present disclosure. FIG. 7 is a schematic illustration of a single-switch buck converter 700 according to various aspects of the present disclosure. In many respects, converter 700 is substantially similar to the buck converter 600 disclosed with respect to FIG. 6. In various embodiments, the buck converter 700 includes a switch controller 102, a gate driver 104, an inductor 112, a capacitor 114, a load modeled as a resistor 116, a feedback monitor 118, a pulse-width modulation controller 120, and/or a high-side device 602. These are substantially similar to the respective elements described with reference to FIG. 6.

A low-side diode 702 substitutes for the low-side device 604 of converter 600. Design and operation of single-switch buck converter 700 is substantially similar to that disclosed with respect to FIGS. 1 and 6. For example, in a switch-on mode, a gate driver 104 activates a high-side device 602. In various embodiments, the high-side device 108 includes an n-type or p-type laterally diffused metal-oxide-semiconductor (LDMOS) device, a power MOSFET such as a vertically diffused MOS (VDMOS) device, a conventional MOSFET device, and/or another transistor. When activated, current flow through the high-side device 108 charges the inductor 112. In the switch-off mode, the high-side device 108 is deactivated and current flows through the diode 702. In the switch-off mode, the inductor 112 discharges stored energy to maintain a constant $V_{out}$ across the resistive load. In this configuration, the high-side device 602 may be configured and sized according to the principles disclosed above.

Figure 8:
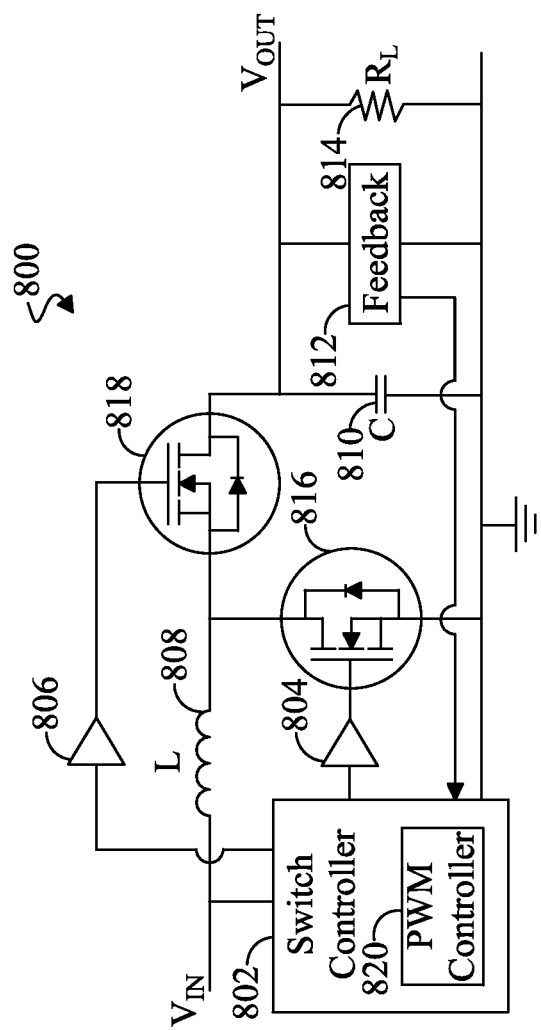
FIG. 8 is a schematic illustration of a DC/DC converter circuit according to various aspects of the present disclosure.

FIG. 8 is a schematic illustration of a DC/DC converter circuit 800 according to various aspects of the present disclosure. Converter circuit 800 may be referred to as a boost circuit and, in various embodiments, contains a switch controller 802, gate drivers 804 and 806, an inductor 808, a capacitor 810, a feedback monitor 812, and a load modeled as a resistor 814. These are substantially similar to the respective elements described with reference to FIG. 1. However, the configuration leads to different behavior for the converter circuit 800.

Converter circuit 800 steps-up a source voltage $V_{in}$ to a larger output voltage $V_{out}$. To do so, the converter circuit 800 charges and discharges the inductor 808 by cycling between a switch-on mode and a switch-off mode. In the switch-on mode, a gate driver 804 activates a charging device 816. When activated, current flow through the charging device 816 charges the inductor 808. The charging device 816 may include a transistor such as LDMOS, a power MOSFET, and/or a regular FET device. The charging device 816 may also include an integrated body diode or a separate diode such as a Schottky diode. In the switch-off mode, a gate driver 806 activates a discharging device 818. In the switch-off mode, the inductor 808 discharges stored energy to produce a constant $V_{out}$ across the resistive load. As with the charging device 816, the discharging device 818 may include a transistor. The discharging device 818 may also include an integrated body diode or a separate diode such as a Schottky diode. In an embodiment, the duty cycle and therefore the gain, is controlled by a pulse-width modulation (PWM) controller 820 incorporated into the switch controller 802. Because of the symmetry of arrangement and operation, the charging device 816 and the discharging device 818 may be referred to as a complimentary pair of switched devices.

In various embodiments, the converter circuit 800 is subject to one or more of the real-world behaviors described with reference to voltage converter 100. These include power loss through the charging device 816 and discharging device 818 and guard banding in the duty cycle to protect against both the charging device 816 and the discharging device 818 being active at the same time, as well as others. Therefore, for these reasons and others, in some embodiments, the charging device 816 and/or the discharging device 818 is configured in accordance with the principles described above.

In some exemplary embodiments where $V_{out}$ is 14V, the converter circuit 800 incorporates a charging device 816 with an HCI rating such as an HCI nominal operating area, a 10-year safe operating area, and/or a 0.2-year safe operating area of less than 14V. In one such embodiment, an LDMOS charging device 816 is characterized by a shorter drift region length than a reference LDMOS device with an NOA rating of 14V. In another embodiment where $V_{out}$ is 14V, the converter circuit 800 includes an LDMOS charging device 816 characterized by a shorter drift region length but an equivalent breakdown voltage as compared to a reference LDMOS device with an NOA rating of 14V.

In some embodiments where $V_{out}$ is 14V, the converter circuit 800 includes a discharging device 818 with an HCI rating of less than 14V. In one such embodiment, an LDMOS discharging device 818 is characterized by a shorter drift region length than a reference LDMOS device with an HCI rating of 14V. In another embodiment where $V_{out}$ is 14V, the converter circuit 800 includes an LDMOS discharging device 818 characterized by a shorter drift region length but an equivalent breakdown voltage as compared to a reference LDMOS device with an NOA rating of 14V.

In some embodiments, the charging device 816 and/or the discharging device 818 includes a regular MOSFET device. The MOSFET device (e.g., charging device 816 or discharging device 818) may be characterized by a reduced HCI rating compared to a reference device with an HCI rating meeting or exceeding $V_{out}$. The MOSFET device may be further characterized by an equivalent breakdown voltage compared to the reference device. Thus, in some embodiments, the MOSFET device has a reduced gate length and accordingly lower $R_{on}$ and $C_g$ compared to the reference device. For example, in some embodiments, the gate length may be reduced anywhere from 5% to 10-15%.

In further embodiments, a peak operating voltage $V_{ds}$ is determined for the charging device 816 and/or discharging device 818 instead of using $V_{out}$ as the reference voltage. The peak operating voltage $V_{ds}$ may meet or exceed $V_{in}$ and/or $V_{out}$. In some such embodiments, the device or devices are configured to have an HCI rating of less than the peak operating voltage $V_{ds}$. The same devices may be further configured to have breakdown voltage, such as $BV_{dss}$, exceeding or meeting the peak operating voltage $V_{ds}$.

Figure 9:
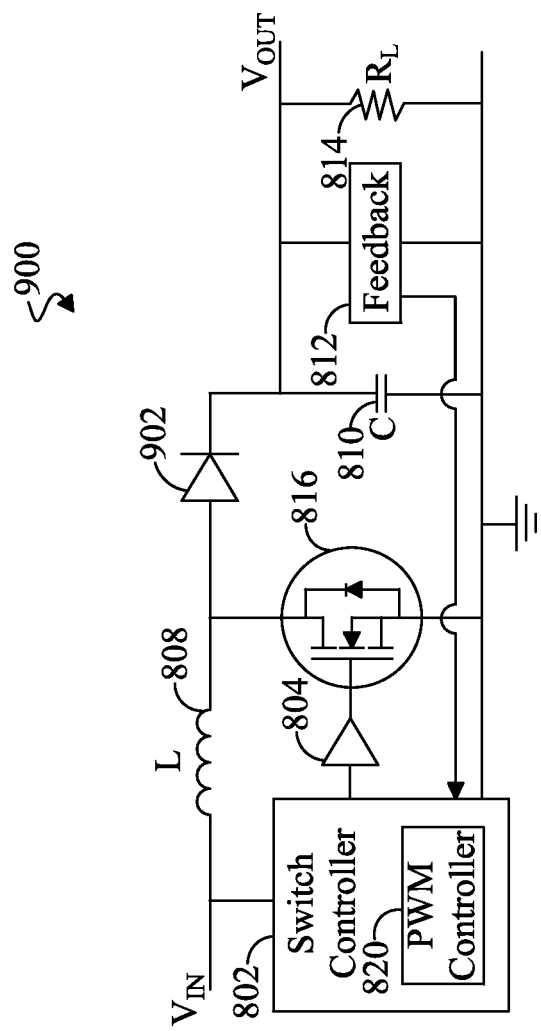
FIG. 9 is a schematic illustration of a single-switch DC/DC converter circuit according to various aspects of the present disclosure.

FIG. 9 is a schematic illustration of a single-switch DC/DC converter circuit 900 according to various aspects of the present disclosure. In many respects, converter 900 is substantially similar to the converter circuit 800 disclosed with respect to FIG. 8. In various embodiments, converter circuit 900 contains a switch controller 802, a gate driver 804, an inductor 808, a capacitor 810, a feedback monitor 812, a load modeled as a resistor 814, a charging device 816, and/or a pulse-width modulation controller 820. These are substantially similar to the respective elements described with reference to FIG. 8.

A discharge diode 902 substitutes for the discharging device 818 of converter 800. Design and operation of single-switch converter circuit 900 is substantially similar to that disclosed with respect to FIG. 8. For example, in a switch-on mode, a gate driver 804 activates a charging device 816. When activated, current flow through the charging device 816 allows the inductor 808 to charge. The charging device 816 may include a transistor such as LDMOS, a power MOSFET, and/or a regular FET device. The charging device 816 may also include an integrated body diode or a separate diode such as a Schottky diode. In a switch-off mode, current flows through the diode 902, which causes the inductor 808 to discharge stored energy and produce a constant $V_{out}$ across the resistive load 814. In this configuration, the charging device 816 may be configured and sized according to the principles disclosed above.

As noted, the switched circuits presented (e.g., voltage converter 100, buck converter 600, single-switch buck converter 700, DC/DC converter circuit 800, and single-switch converter circuit 900) are merely exemplary applications of the present disclosure. Other embodiments include further applications of the principles disclosed herein.

Figure 10:
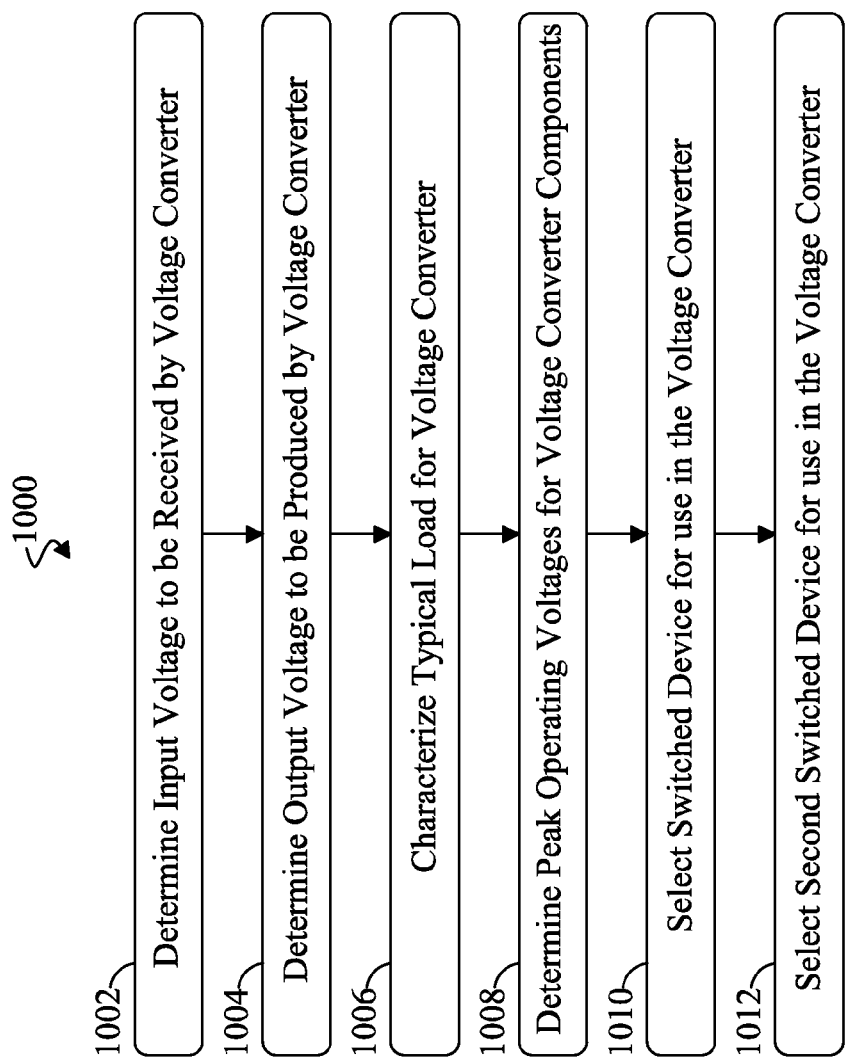
FIG. 10 is a flowchart of a method of designing a voltage converter according to various aspects of the present disclosure.

FIG. 10 is a flowchart of a method 1000 of designing a voltage converter according to various aspects of the present disclosure. It is understood that additional steps can be provided before, during, and after the method 1000, and some of the steps described can be replaced or eliminated for other embodiments of the method. In block 1002, an input voltage to be received by the voltage converter is determined. In various exemplary embodiments, the input voltage $V_{in}$ is 1.5V, 4V, 6V, 9V, 14, 24V, and 26.4V. In block 1004, an output voltage to be produced by the voltage converter is determined. The output voltage $V_{out}$ may be stepped up or stepped down from the input voltage $V_{in}$ and may also have a voltage offset relative to $V_{in}$. In block 1006, a typical load for the voltage converter is characterized. This may include determining a load resistance $R_L$, determining capacitive and/or inductive load behavior, and/or determining peak current requirements, as well as determining other relevant load characteristics. In block 1008, a peak operating voltage may be determined for components of the voltage converter including one or more switched devices. In block 1010, a switched device is selected for use in the voltage converter. In some embodiments, the selected switched device has a drain-to-source breakdown voltage, for example BVdss, greater than or substantially equal to the greater of the input voltage and the output voltage and has a hot-carrier injection rating (e.g., an HCI nominal operating area, a 10-year safe operating area, a 0.2-year safe operating area, etc.) less than the greater of the input voltage and the output voltage. In some embodiments, the selected switched device has a drain-to-source breakdown voltage greater than or substantially equal to the peak operating voltage for the switched device and has a hot-carrier injection rating less than the peak operating voltage. In some embodiments, the switched device may be part of a complementary pair of switched devices. In block 1012, the second switched device of the complementary pair may be selected. The second switched device may be configured to have a drain-to-source breakdown voltage greater than or substantially equal to the greater of the input voltage and the output voltage and a hot-carrier injection rating less than the greater of the input voltage and the output voltage. The second switched device may also have a drain-to-source breakdown voltage greater than or substantially equal to the peak operating voltage for the second switched device and a hot-carrier injection rating less than the peak operating voltage.

Thus, a structure and method for a switched circuit device are provided. In some exemplary embodiments, a semiconductor circuit is disclosed, the circuit comprising: a switch controller; and a switched device communicatively coupled to the switch controller, the switch controller controlling a duty cycle of the switched device; wherein the switched device is characterized by a drain-to-source breakdown voltage greater than or substantially equal to the source voltage and the output voltage; and wherein the switched device is further characterized by a hot-carrier injection rating less than the source voltage or the output voltage. In one such embodiment, the hot-carrier injection rating is a nominal operating area rating. In another such embodiment, the hot-carrier injection rating is a DC 0.2-year safe operating area rating. In some such embodiments, the switched device is a first switched device; the semiconductor circuit further comprises a second switched device communicatively coupled to the switch controller, the switch controller further controlling a duty cycle of the second switched device; the first and second switched devices are part of a complementary pair; the second switched device is characterized by a drain-to-source breakdown voltage greater than or substantially equal to the source voltage and the output voltage; and the second switched device is further characterized by a hot-carrier injection rating less than the source voltage or the output voltage. In another such embodiment, the semiconductor circuit is configured as a buck converter, and the output voltage is less than the source voltage. In another such embodiment, the semiconductor circuit is configured as a boost converter, and the output voltage is greater than the source voltage. In another such embodiment, the switched device is a laterally diffused metal-oxide-semiconductor (LDMOS) device; and a drift region length of the switched device determines the breakdown voltage and the hot-carrier injection rating. In a further such embodiment, the switched device is a field-effect transistor (FET) device; and a channel region length of the switched device determines the breakdown voltage and the hot-carrier injection rating.

In further exemplary embodiments, a circuit device receiving an input voltage and producing an output voltage is disclosed, the circuit device comprising: a switch controller; and a switched device communicatively coupled to the switch controller, the switch controller controlling a duty cycle of the switched device to produce the output voltage; wherein the switched device is configured to receive a peak drain-to-source operating voltage; wherein the switched device is characterized by a drain-to-source breakdown voltage greater than or substantially equal to the peak operating voltage; and wherein the switched device is further characterized by a hot-carrier injection rating less than the peak operating voltage. In one such embodiment, the hot-carrier injection rating is a nominal operating area rating. In another such embodiment, the hot-carrier injection rating is a DC 0.2-year safe operating area rating. In another such embodiment, the circuit device further comprises a switched voltage converter, the switched voltage converter including the switched device and the switch controller. In another such embodiment, the switched device is a laterally diffused metal-oxide-semiconductor (LDMOS) device; and a drift region length of the switched device determines the breakdown voltage and the hot-carrier injection rating. In another such embodiment, the drift region length of the switched device is less than a drift region length of a comparable switched device, the comparable switched device characterized by a drain-to-source breakdown voltage substantially equal to the breakdown voltage of the switched device and a hot-carrier injection rating greater than the peak operating voltage. In another such embodiment, the switched device is a field-effect transistor (FET) device; and a channel region length of the switched device determines the breakdown voltage and the hot-carrier injection rating. In another such embodiment, the channel region length of the switched device is less than a channel region length of a comparable switched device, the comparable switched device characterized by a drain-to-source breakdown voltage substantially equal to the breakdown voltage of the switched device and a hot-carrier injection rating greater than the peak operating voltage.

In some exemplary embodiments, a method of designing a voltage converter is disclosed, the method comprising: determining an input voltage to be received by the voltage converter; determining an output voltage to be produced by the voltage converter; characterizing a typical load of the voltage converter; and selecting a switched device for use in the voltage converter, the switched device having a drain-to-source breakdown voltage greater than or substantially equal to the input voltage and the output voltage and a hot-carrier injection rating less than the input voltage or the output voltage. In some embodiments, the switched device is a first switched device, and the method further comprises selecting a second switched device having a drain-to-source breakdown voltage greater than or substantially equal to the input voltage and the output voltage and a hot-carrier injection rating less than the input voltage or the output voltage, and the first and second switched devices are part of a complimentary pair. In some such embodiments, the method further comprises determining a peak operating voltage for the switched device, and the selected switched device further has a drain-to-source breakdown voltage greater than or substantially equal to the peak operating voltage and a hot-carrier injection rating less than the peak operating voltage. In some such embodiments, the hot-carrier injection rating is a DC 0.2-year safe operating area rating.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor circuit for receiving a source voltage and producing an output voltage, the circuit comprising:
    a switch controller;
    a switched device communicatively coupled to the switch controller and having a source and drain, the switch controller controlling a duty cycle of the switched device;
    a diode coupled between the source and the drain of the switched device; and
    an inductor coupled to at least one of the source of the switched device or the drain of the switched device;
    wherein the inductor is directly electrically coupled to a body of the switched device;
    wherein the switched device is characterized by a drain-to-source breakdown voltage greater than or substantially equal to a greater of the source voltage and the output voltage; and
    wherein the switched device is further characterized by a hot-carrier injection rating less than a greater of the source voltage and the output voltage.

2. The semiconductor circuit of claim 1, wherein the hot-carrier injection rating is a nominal operating area rating.

3. The semiconductor circuit of claim 1, wherein the hot-carrier injection rating is a DC 0.2-year safe operating area rating.

4. The semiconductor circuit of claim 1,
    wherein the switched device is a first switched device;
    wherein the semiconductor circuit further comprises a second switched device communicatively coupled to the switch controller, the switch controller further controlling a duty cycle of the second switched device;
    wherein the first and second switched devices are part of a complementary pair;
    wherein the second switched device is characterized by a drain-to-source breakdown voltage greater than or substantially equal to a greater of the source voltage and the output voltage; and
    wherein the second switched device is further characterized by a hot-carrier injection rating less than a greater of the source voltage and the output voltage.

5. The semiconductor circuit of claim 1 configured as a buck converter, wherein the output voltage is less than the source voltage, and wherein the inductor is arranged to provide the output voltage.

6. The semiconductor circuit of claim 1 configured as a boost converter, wherein the output voltage is greater than the source voltage, and wherein the inductor is arranged to receive the source voltage.

7. The semiconductor circuit of claim 1,
wherein the switched device is a laterally diffused metal-oxide-semiconductor (LDMOS) device; and
wherein a drift region length of the switched device determines the breakdown voltage and the hot-carrier injection rating.

8. The semiconductor circuit of claim 1,
wherein the switched device is a field-effect transistor (FET) device; and
wherein a channel region length of the switched device determines the breakdown voltage and the hot-carrier injection rating.

9. A circuit device receiving an input voltage and producing an output voltage, the circuit device comprising:
a switch controller;
a switched device communicatively coupled to the switch controller and having a drain and a source, the switch controller controlling a duty cycle of the switched device to produce the output voltage;
a diode coupled to the source and the drain of the switched device;
an inductor directly electrically coupled to a body of the switched device and at least one of the drain of the switched device and the source of the switched device;
wherein the switched device is configured to receive a peak drain-to-source operating voltage;
wherein the switched device is characterized by a drain-to-source breakdown voltage greater than or substantially equal to the peak operating voltage; and
wherein the switched device is further characterized by a hot-carrier injection rating less than the peak operating voltage.

10. The circuit device of claim 9, wherein the hot-carrier injection rating is a nominal operating area rating.

11. The circuit device of claim 9, wherein the hot-carrier injection rating is a DC 0.2-year safe operating area rating.

12. The circuit device of claim 9 further comprising a switched voltage converter, the switched voltage converter including the switched device and the switch controller.

13. The circuit device of claim 9,
wherein the switched device is a laterally diffused metal-oxide-semiconductor (LDMOS) device; and
wherein a drift region length of the switched device determines the breakdown voltage and the hot-carrier injection rating.

14. The circuit device of claim 13, wherein the drift region length of the switched device is less than a drift region length of a comparable switched device, the comparable switched device characterized by:
a drain-to-source breakdown voltage substantially equal to the breakdown voltage of the switched device, and
a hot-carrier injection rating greater than the peak operating voltage.

15. The circuit device of claim 9,
wherein the switched device is a field-effect transistor (FET) device; and
wherein a channel region length of the switched device determines the breakdown voltage and the hot-carrier injection rating.

16. The circuit device of claim 15, wherein the channel region length of the switched device is less than a channel region length of a comparable switched device, the comparable switched device characterized by:
a drain-to-source breakdown voltage substantially equal to the breakdown voltage of the switched device, and
a hot-carrier injection rating greater than the peak operating voltage.

17. A method of designing a voltage converter, the method comprising:
determining an input voltage to be received by the voltage converter;
determining an output voltage to be produced by the voltage converter by adjusting a duty cycle of a switched device of the voltage converter;
determining a peak voltage experienced by the switched device during the duty cycle;
characterizing a typical load of the voltage converter; and
selecting a size for a drift region of the switched device for use in the voltage converter such that a drain-to-source breakdown voltage of the switched device is greater than or substantially equal to the peak voltage and a hot-carrier injection rating of the switched device is less than the peak voltage, wherein the drift region is defined by a dielectric feature and a well region of the switched device.

18. The method of claim 17,
wherein the switched device is a first switched device;
the method further comprising selecting a second switched device having a drain-to-source breakdown voltage greater than or substantially equal to a greater of the input voltage and the output voltage and a hot-carrier injection rating less than a greater of the input voltage and the output voltage;
wherein the first and second switched devices are part of a complimentary pair.

19. The method of claim 17, wherein the hot-carrier injection rating is a DC 0.2-year safe operating area rating.

20. The method of claim 17, wherein the dielectric feature is disposed between a source region of the switched device and a drain region of the switched device.

* * * * *